United States Patent
Rotondaro et al.

(10) Patent No.: US 6,783,997 B2
(45) Date of Patent: Aug. 31, 2004

(54) GATE STRUCTURE AND METHOD

(75) Inventors: Antonio L. P. Rotondaro, Dallas, TX (US); Mark R. Visokay, Richardson, TX (US); Luigi Colombo, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/325,371

(22) Filed: Dec. 19, 2002

(65) Prior Publication Data

US 2003/0148633 A1 Aug. 7, 2003

Related U.S. Application Data

(60) Provisional application No. 60/342,068, filed on Dec. 19, 2001.

(51) Int. Cl.[7] .................. H01L 21/00; H01L 21/66; H01L 21/336; G01R 31/26
(52) U.S. Cl. .................. 438/3; 438/14; 438/287
(58) Field of Search .................. 438/3, 14, 240, 438/287, 381, 770, 785

(56) References Cited

U.S. PATENT DOCUMENTS

| | | | | | |
|---|---|---|---|---|---|
| 5,746,829 | A | * | 5/1998 | Matsunaga et al. | 117/203 |
| 6,020,243 | A | * | 2/2000 | Wallace et al. | 438/287 |
| 6,291,867 | B1 | * | 9/2001 | Wallace et al. | 257/410 |
| 6,395,650 | B1 | * | 5/2002 | Callegari et al. | 438/785 |
| 6,413,386 | B1 | * | 7/2002 | Callegari et al. | 438/381 |
| 6,451,641 | B1 | * | 9/2002 | Halliyal et al. | 438/287 |
| 6,451,647 | B1 | * | 9/2002 | Yang et al. | 438/240 |
| 6,541,286 | B1 | * | 4/2003 | Bernard et al. | 438/14 |
| 6,544,906 | B2 | * | 4/2003 | Rotondaro et al. | 438/785 |
| 6,596,547 | B2 | * | 7/2003 | Aggarwal et al. | 438/3 |
| 6,613,697 | B1 | * | 9/2003 | Faur et al. | 438/770 |
| 6,617,639 | B1 | * | 9/2003 | Wang et al. | 257/324 |

* cited by examiner

Primary Examiner—John F. Niebling
Assistant Examiner—Walter L. Lindsay, Jr.
(74) Attorney, Agent, or Firm—Carlton H. Hoel; W. James Brady; Frederick J. Telecky, Jr.

(57) ABSTRACT

MOSFET fabrication methods with high-k gate dielectrics for silicon or metal gates with gate dielectric deposition control including TXRF. TXRF permits analysis of gate (or capacitor) high-k dielectrics down to about 5 nm thickness.

4 Claims, 7 Drawing Sheets

Hf Count Rates vs. Film Thickness

GATE STRUCTURE AND METHOD

CROSS-REFERENCE TO RELATED APPLICATIONS

This application claims priority from provisional patent application Serial No. 60/342,068, filed Dec. 19, 2001. The following patent applications disclose related subject matter: Ser. No. 10/349,686, filed Jan. 23, 2003. These applications have a common assignee with the present application.

BACKGROUND OF THE INVENTION

The invention relates to electronic semiconductor devices, and, more particularly, to gate structures and fabrication methods for integrated circuits.

The trend in semiconductor integrated circuits to higher device densities by down-scaling structure sizes and operating voltages has led to silicon field effect (MOS) transistor gate dielectrics, typically made of silicon dioxide, to approach thicknesses on the order of 1–2 nm to maintain the capacitive coupling of the gate to the channel. However, such thin oxides present leakage current problems due to carrier tunneling through the oxide. Consequently, alternative gate dielectrics with greater dielectric constants to permit greater physical thicknesses have been proposed. Indeed, $Ta_2O_5$, $(Ba,Sr)TiO_3$, and other high dielectric constant materials have been suggested, but such materials have poor interface stability with silicon.

Wilk and Wallace, Electrical Properties of Hafnium Silicate Gate Dielectrics Deposited Directly on Silicon, 74 Appl. Phys. Lett. 2854 (1999), disclose measurements on capacitors with a hafnium silicate dielectric formed by sputtering (at a pressure of $5 \times 10^{-6}$ Torr and substrate temperature of 500° C.) a 5-nm thick layer of $Hf_6Si_{29}O_{65}$ directly onto silicon together with a gold top electrode deposited on the silicate dielectric. Such capacitors showed low leakage current, thermal stability, an effective dielectric constant of about 11, and a breakdown field of 10 MV/cm.

However, such silicate dielectrics need better electrical properties for use in high volume production silicon integrated circuits.

Total reflection X-ray fluorescence (TXRF) is an analysis tool useful in integrated circuit manufacturing for detection of surface contaminants. For example, Liou et al, Applications of Total Reflection X-Ray Fluorescence to Analysis of VLSI Micro Contamination, 12 IEEE Trans. Semi. Manuf. 266 (1999) and Smith et al, Understanding the Correlation of TXRF and SurfaceSIMS, 1998 Intl. Conf. Ion Implantation Proc. 1063 (1998).

SUMMARY OF THE INVENTION

The present invention provides integrated circuit fabrication with total reflection x-ray fluorescence for composition control of silicate dielectrics.

This has the advantages including non-destructive control.

BRIEF DESCRIPTION OF THE DRAWINGS

The drawings are heuristic for clarity.

DESCRIPTION OF THE PREFERRED EMBODIMENTS

1. Overview

Preferred embodiment fabrication methods include total reflection x-ray fluorescence (TXRF) monitoring of composition and deposition of gate dielectric material. Particular gate dielectrics include compositions approximating (if stoichiometric) $Hf_xSi_{1-x}O_2$ and $Zr_xSi_{1-x}O_2$ ($0 \leq x < 1$) plus nitrides of these such as $Hf_wSi_xO_yN_z$ where the ratio of O to N may be roughly in the range of 10:1 to 1:1. Dielectric deposition may be by sputtering using an oxygen or nitrogen atmosphere, chemical vapor deposition with various precursors or atomic layer deposition.

2. High-k Metal-Si-oxynitride Gate Dielectric Preferred Embodiments

FIGS. 1a–1f illustrate in cross sectional elevation views the steps of first preferred embodiment fabrication methods for integrated circuits including field effect transistors (e.g., CMOS or BiCMOS) with high-k gate dielectrics and polysilicon gates. The preferred embodiments include the following steps:

(1) Substrate

Figure 1A:
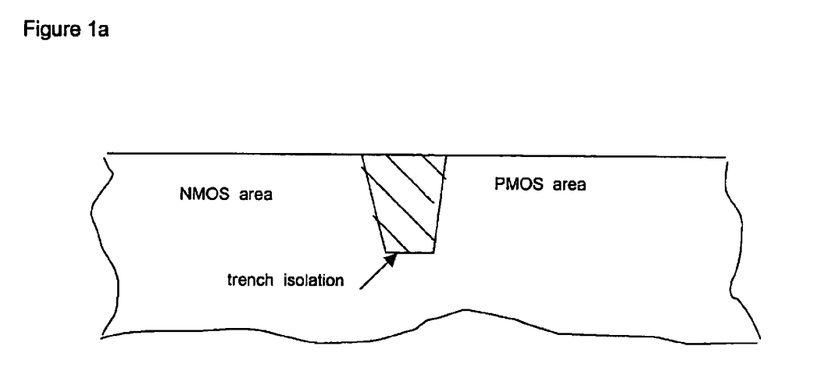
FIGS. 1a–1f are cross sectional elevation views of steps of a preferred embodiment integrated circuit fabrication method.

Start with a p-type silicon (or silicon-on-insulator) wafer with <100> orientation and form shallow trench isolation by pad oxide growth, nitride deposition, trench pattern, nitride-oxide-silicon trench etch, trench surface oxidation, trench fill by blanket oxide deposition, etch-CMP planarization, and nitride strip. FIG. 1a is a cross-sectional elevation view of the substrate illustrating the trench isolation and locations for fabrication of NMOS and PMOS transistors. Next, perform multiple dopant implants to form n- and p-type wells (plus, optionally, memory cell array wells and bipolar device buried layers) plus form channel stop regions, punch-through deterrence regions, and threshold adjust regions. These implants are performed through the residual pad oxide. During NMOS transistor location implants the PMOS areas are masked off; and a similar NMOS-masked implant occurs in the PMOS locations. Note that the implant doses and depths may differ for memory cell array transistors as compared to peripheral transistors. Also, both high and low voltage transistors of the same type may be formed and may have different implant doses and depths. A rapid thermal anneal (e.g., 1050° C. for 30 s) activates and diffuses the implanted dopants (e.g., boron and phosphorus).

(2) Surface Preparation

Prior to gate dielectric formation, the surface of the substrate from step (1) is cleaned, including removal of any residual silicon dioxide, with a last dilute HF rinse. A thin silicon dioxide layer may be re-grown prior to deposition of the high dielectric constant layer. The prepared substrate is then put into a vacuum deposition chamber; optionally surface contaminants are desorbed by heating. The desorption can take place in the deposition chamber or in another chamber, and the wafer then transferred to the deposition chamber under controlled ambient.

(3) Gate Dielectric Deposition

Figure 1B:
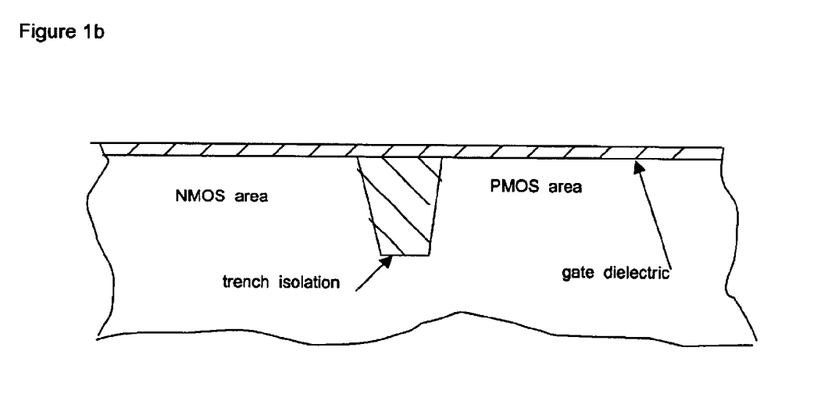
Figure 1C:
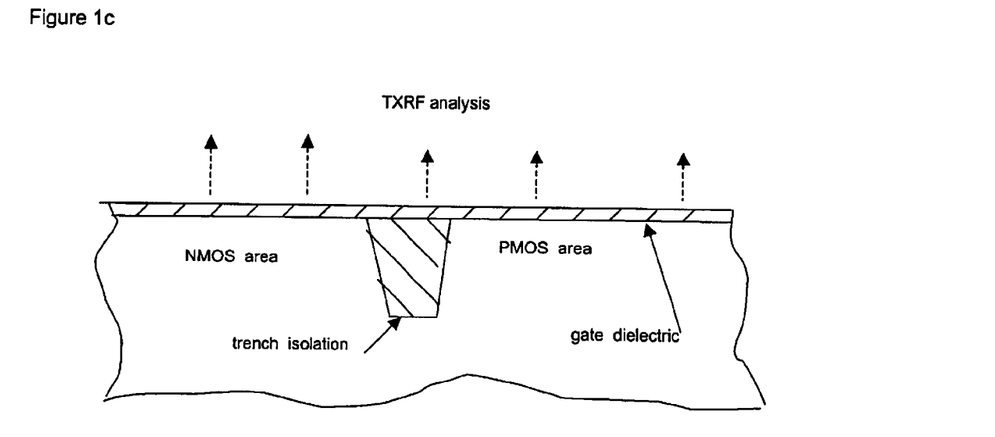
Figure 1D:
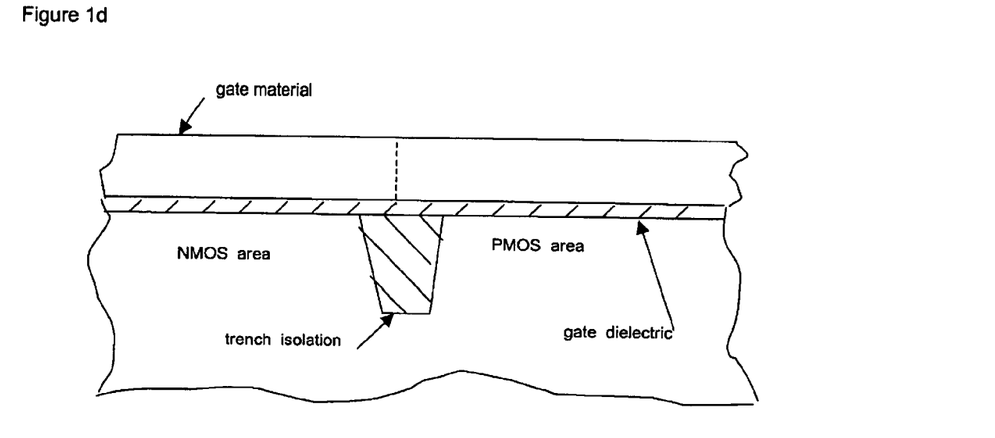

Deposit the gate dielectric onto the substrate from step (2); a variety of possible deposition methods exist (CVD, PVD, etc). Preferably, use a sputtering process comprising a $Hf_{0.5}Si_{0.5}$ target and a nitrogen-containing plasma to deposit a dielectric of composition roughly $Hf_{13.4}Si_{22.2}O_{33.1}N_{31.3}$ (XPS data from experiments) that is, a ratio of cations to anions of roughly 1 to 2 as in $SiO_2$ and $HfO_2$. This deposition of this metal silicon oxynitride results in an effective dielectric constant of about 14, so a 7 nm thick silicate nitride has an equivalent silicon dioxide thickness (EOT) of 2 nm but not the leakage (tunneling) current of such a thin silicon dioxide gate dielectric. It should be noted that the dielectric film does not necessarily need to contain nitrogen. See FIG. 1b illustrating the gate dielectric layer on both the silicon areas and the shallow trench isolation.

(3') Split Gate Option

Various integrated circuits include both high voltage and low voltage transistors; that is, MOS transistors with differing operating voltages such as differing maximum source-drain voltages and gate-source voltages. For example, high voltage transistors could be used for peripheral transistors or programmable transistors, and low voltage transistors used for central processor or memory array transistors to limit power consumption and heat generation. High voltage MOS transistors require a thicker gate dielectric than low voltage MOS transistors in order to avoid breakdown. A modification of the foregoing step (3) can provide for two or more transistor gate dielectric thicknesses through various approaches. For example, first grow a thin silicon dioxide layer; next, strip this oxide layer in areas for low voltage transistors; then perform the passivation and high-k dielectric deposition of step (3) with the thickness of this dielectric layer targeted for the low voltage transistors. The remnant initial grown oxide under the high-k dielectric in the areas for high voltage transistors provides the required extra dielectric thickness.

(4) Silicate Gate Dielectric Analysis.

Figure 2A:
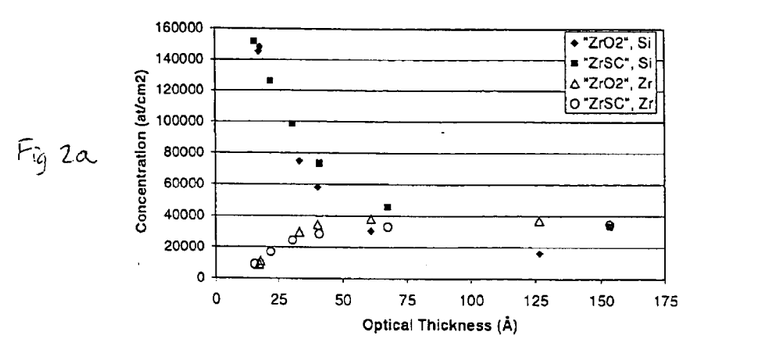
FIGS. 2a–2d illustrate preferred embodiment TXRF.
Figure 2B:
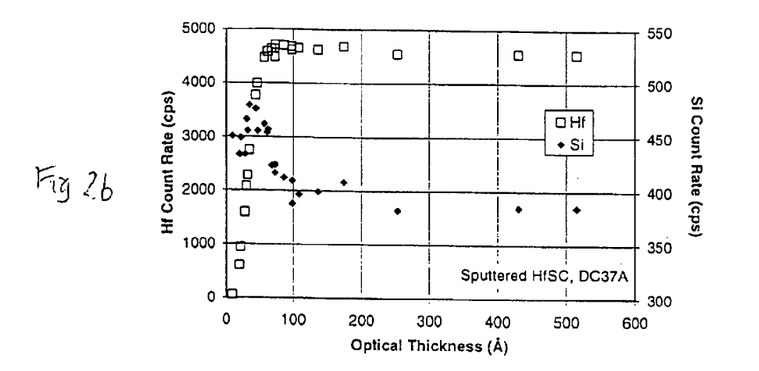
Figure 2C:
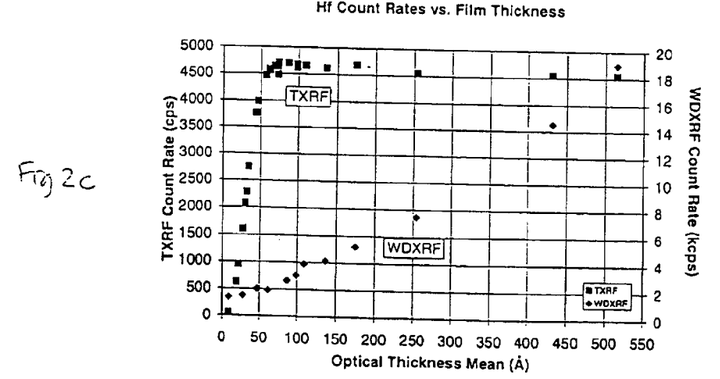
Figure 2D:
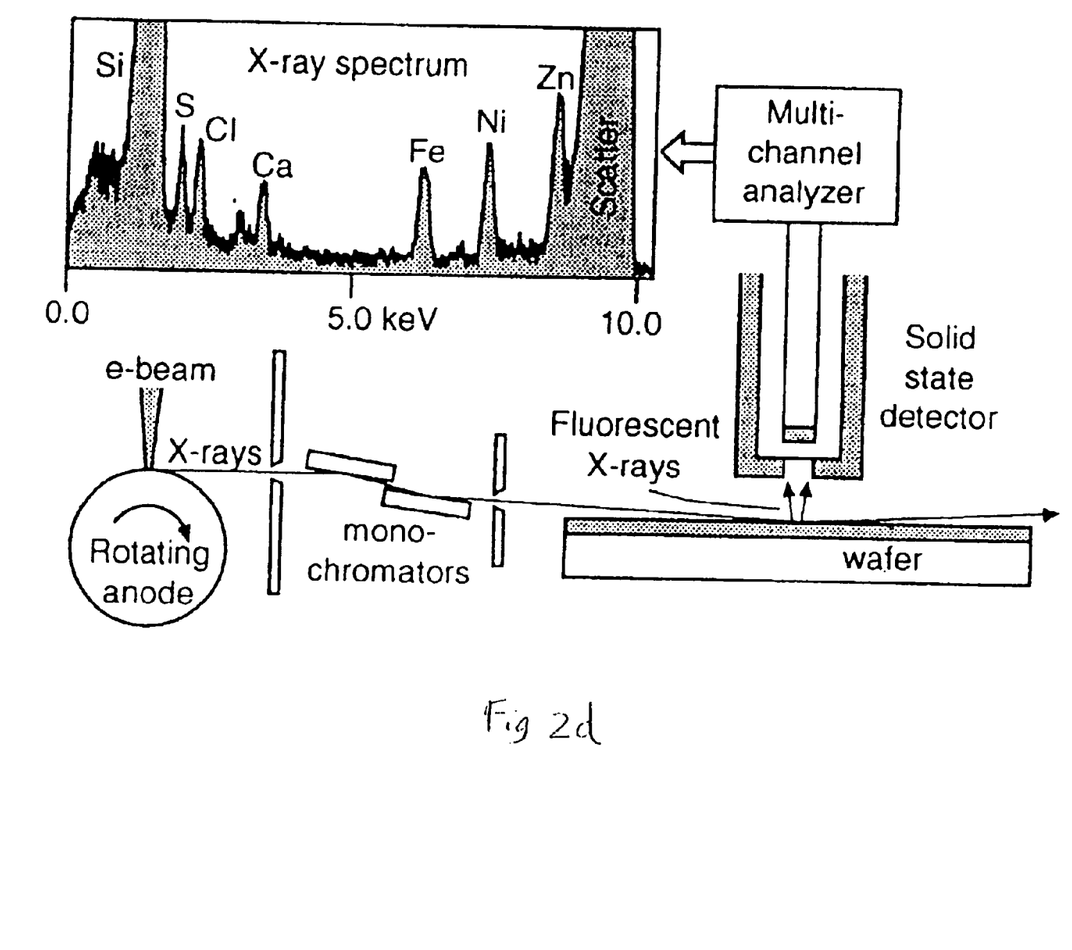

After the timed LPCVD or sputtering of silicate gate dielectric material layer of the foregoing step (3) or (3'), measure the layer thickness by ellipsometry and the layer composition by TXRF (total reflection X-ray fluorescence) analysis. FIG. 2d heuristically illustrates a TXRF system. TXRF can measure compositions of hafnium silicate and zirconium silicate layers as thin as 5 nm on silicon substrates, and such composition measurements provide feedback control of the deposition of step (3) or (3'). For example, the deposition process can be periodically qualified and the film can be analyzed just after silicate deposition, the results being used to control the deposition conditions, such as substrate temperature, pressure, flow rates, deposition chamber drift, precursors mixture, and so forth. TXRF can also detect contamination by other elements, such as Ti, La, Ba, . . . and does not require any special sample preparation. In particular, FIG. 2a shows results from various thickness $Zr_{0.55}Si_{0.45}O_2$ on Si: For thickness greater than about 5 nm both the Zr and Si concentrations reach the stable value related to the deposited film and indicate that the measurements are not affected by the substrate. FIG. 2b shows similar results for $Hf_{0.55}Si_{0.45}O_2$. Other techniques which use X-ray fluorescence do not benefit from the total reflection and are severely affected by the substrate signal making it impossible to determine the Si concentration of the dielectric directly as in the case of TXRF. The fact that WDXRF (wave dispersive X-ray fluorescence) measurement has a very deep penetration distorts the calculated concentration of the elements of the dielectric. This can be seen in FIG. 2c, the Hf counts per second grows monotonically with the layer thickness in the case of WDXRF. In the case of TXRF the counts per second saturate for layers thicker than about 5–7 nm and are independent of the layer thickness for greater thickness. As a result, for these thicker films, where both the Hf(Zr) and Si signals are saturated, the relative intensities are influenced by their relative concentrations in the bulk of the film rather than by the film thickness. By using films of sufficient thickness, in-line (in-fab) process monitoring is possible. This approach should also be usable for any M—Si—O or M—Si—O—N compound and for films of minimal thickness about 5 nm.

(5) High-k Gate Dielectric Oxidation

The $Hf_{13.4}Si_{22.2}O_{33.1}N_{31.3}$ gate dielectric layer deposited in step (3) or (3') may have defects such as oxygen vacancies (and incorporated carbon if deposited by CVD with organic precursors) which can lead to large leakage currents. Thus oxidize the high-k oxynitride dielectric layer; possibly with a mild liquid oxidant.

(6) Gate Material Deposition

Deposit a layer of polysilicon (or amorphous silicon) gate material of thickness <200 nm on the treated high-k gate dielectric from step (5). The deposition may be decomposition of silane. Then dope the gate material $n^+$ and $p^+$ type in the NMOS and PMOS areas, respectively, by non-critical photoresist masking and dopant implantations. (Polysilicon emitters for npn bipolars would be in the $n^+$ type area.) See FIG. 1d. Alternative gate materials such as metals and/or metal silicides, oxides or nitrides could be used, but two different metals may be needed to match the optimal NMOS and PMOS gate work functions.

(7) Gates

Spin on a layer of photoresist which is sensitive to deep ultraviolet; optionally, an antireflective coating (ARC) layer could be deposited prior to the photoresist in order to limit interference effects during photoresist exposure. The composition of the ARC and thickness are selected according to the exposure wavelength and the reflectivity of the underlying material. Expose the photoresist through a reticle for gates and gate level interconnects; the exposed minimal linewidth may be about 50 nm. Lastly, develop photoresist and strip exposed ARC, if any.

Use the patterned photoresist as an etch mask for the anisotropic plasma etch of polysilicon to form gates and gate level interconnects. The gate material could also provide a polysilicon emitter for bipolar devices.

Figure 1E:
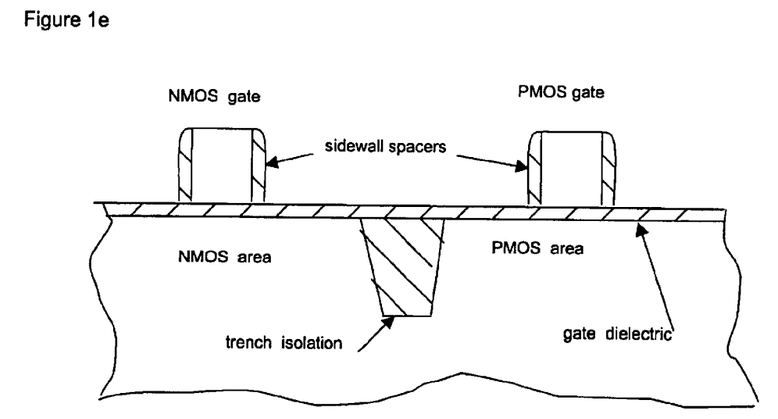

Complete front-end device processing by forming lightly-doped extensions, sidewall spacers, highly-doped source and drain regions, and slicide areas; see FIG. 1e.

(8) Interlevel Dielectric

Figure 1F:
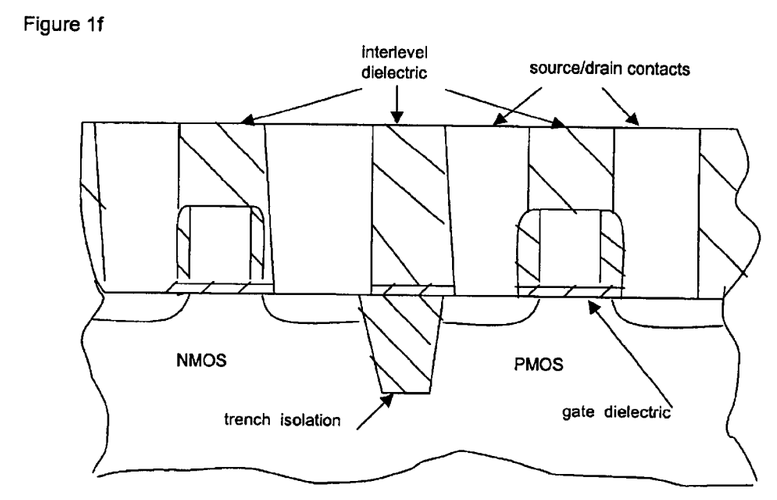

Deposit and planarize an interlevel dielectric layer on the gates, sidewall spacers, and gate dielectric in between. The interlevel dielectric could be a doped (for gettering) silicon dioxide or silicon nitride or a stack of various dielectrics. Next, apply photoresist and pattern it to define source/drain and gate contacts. Then etch vias through the interlevel dielectric and subsequently exposed gate dielectric using the photoresist pattern. Lastly, fill the vias by deposition and etchback of a conductor such as polysilicon or a metal such as tungsten with a TiN barrier layer. This forms the source/drain contacts as illustrated in FIG. 1f.

3. Disposable Gate Preferred Embodiments

Figure 3A:
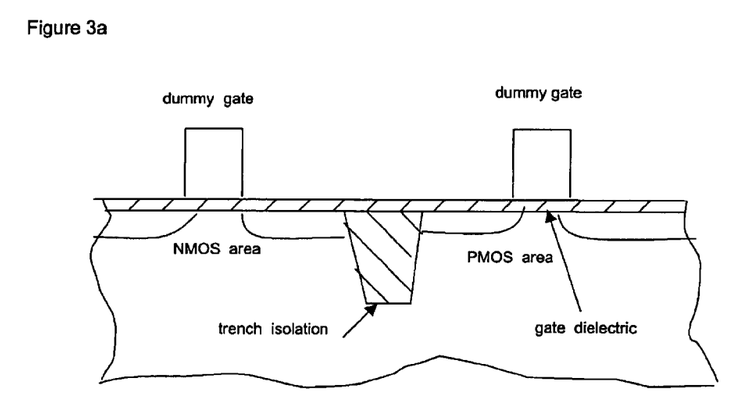
FIGS. 3a–3c are cross sectional elevation views of steps of another preferred embodiment.
Figure 3B:
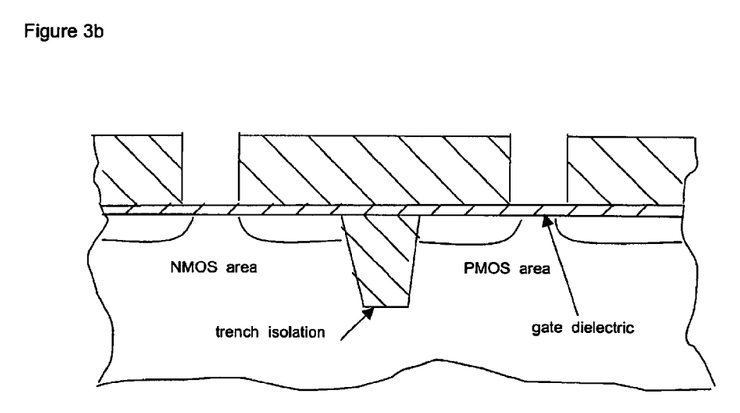
Figure 3C:
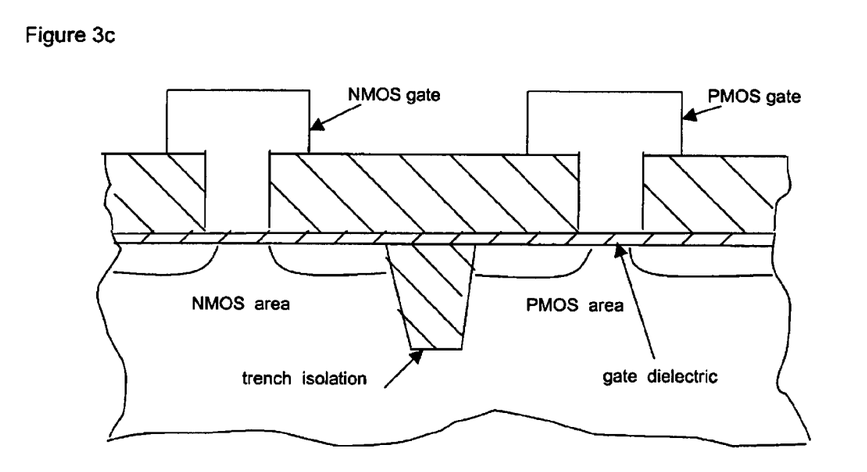

FIGS. 3a–3c illustrate a disposable gate method of integrated circuit fabrication which uses the high-k gate dielectric. In particular, follow the foregoing steps (1)–(7) to have a polysilicon disposable (dummy) gate (with or without sidewall spacers) and source/drains formed in the substrate; see FIG. 3a. Again, apply preferred embodiment TXRF to control the high-k gate dielectric composition and deposition because use of high-k materials implies a dielectric thickness of only a few nm.

Deposit 200-nm-thick dielectric, such as TEOS oxide, and planarize, such as by CMP, to expose the top of the polysilicon dummy gate. The dummy gates may be about 200 nm high and 50 nm long.

Etch out dummy gate with an $HBr+O_2$ plasma which stops on the high-k gate dielectric and forms grooves in the dielectric. At this point apply the preferred embodiment liquid-based oxidation of the high-k gate dielectric as described in foregoing step (5); see FIG. 3b.

Next, blanket deposit gate material, such as polysilicon, metals, alloys, silicides, et cetera, to fill the groove plus cover the dielectric.

Then pattern and etch the gates; see FIG. 3c showing 200 nm thick metal T-shaped gate material.

Alternatively, the original gate dielectric could have been a dummy silicon dioxide and after the removal of the polysilicon dummy gate, strip the dummy gate oxide and and then deposit a new 7 nm thick high-k gate dielectric at the bottom of the groove left by the removal of dummy gate. This also deposits roughly 7 nm of high-k on the sidewalls to shorten the eventual gate to 34 nm. Again, invoke preferred embodiment TXRF control of the high-k dielectric deposition. Then deposit gate material and proceed as before.

4. Modifications

The preferred embodiments can be modified in various ways while retaining the feature of control of gate dielectric formation using TXRF.

For example, the dielectric could be a capacitor dielectric; the dielectric material could be $M_w Si_x O_y N_z$ with M a metal selected from the group consisting of Hf, Zr, La, Gd, Pr, Y, and mixtures thereof; the dielectric layered could be made of multiple sublayers of differing materials.

What is claimed is:

1. A method of dielectric layer fabrication, comprising:

(a) forming a first dielectric layer on a first semiconductor substrate, said dielectric layer including $M_w Si_x O_y N_z$ with M a metal selected from the group consisting of Hf, Zr, La, Gd, Pr, Y, and mixtures thereof;

(b) analyzing said dielectric layer with total reflection x-ray fluorescence; and (c) using the results of step (b) to adjust conditions of step (a) for formation of a second dielectric layer on a second semiconductor substrate.

2. The method of claim 1, wherein:

(a) said dielectric layer is $Hf_{0.55}Si_{0.45}O_2$.

3. The method of claim 1, wherein:

(a) said dielectric layer is $Zr_{0.55}Si_{0.45}O_2$.

4. The method of claim 1, wherein:

(a) said dielectric layer has a thickness of greater than about 5 nm.

* * * * *